United States Patent
Hyun et al.

(12)

(10) Patent No.: US 11,101,397 B2
(45) Date of Patent: Aug. 24, 2021

(54) SOLAR CELL PANEL

(71) Applicant: LG ELECTRONICS INC., Seoul (KR)

(72) Inventors: Daeseon Hyun, Seoul (KR); Hyeyoung Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/107,599

(22) Filed: Aug. 21, 2018

(65) Prior Publication Data

US 2019/0058072 A1    Feb. 21, 2019

(30) Foreign Application Priority Data

Aug. 21, 2017  (KR) .................. 10-2017-0105559

(51) Int. Cl.
*H01L 31/05*     (2014.01)
*H01L 31/02*     (2006.01)
*H01L 23/544*    (2006.01)
*H01L 31/048*    (2014.01)

(52) U.S. Cl.
CPC ........ *H01L 31/0508* (2013.01); *H01L 23/544* (2013.01); *H01L 31/0201* (2013.01); *H01L 31/048* (2013.01); *H01L 31/0516* (2013.01); *H01L 2223/54426* (2013.01)

(58) Field of Classification Search
None
See application file for complete search history.

(56) References Cited

U.S. PATENT DOCUMENTS

| 3,819,417    | A   | 6/1974  | Haynos                         |
|--------------|-----|---------|--------------------------------|
| 2010/0116323 | A1  | 5/2010  | Katayama et al.                |
| 2015/0007865 | A1* | 1/2015  | Steckemetz ......... H01L 31/0504 136/244 |
| 2015/0287849 | A1* | 10/2015 | Kim ............... H01L 31/022425 136/256 |
| 2016/0035907 | A1  | 2/2016  | Lim et al.                     |
| 2016/0149064 | A1* | 5/2016  | Oh ...................... H01L 31/0508 136/244 |

* cited by examiner

*Primary Examiner* — Tamir Ayad
(74) *Attorney, Agent, or Firm* — Birch, Stewart, Kolasch & Birch, LLP

(57) ABSTRACT

Disclosed is a solar cell panel including a plurality of solar cells including a first solar cell and a second solar cell, and a wiring portion extending in a second direction crossing the first direction and electrically connecting the plurality of solar cells. Each of the plurality of solar cells includes a plurality of first electrodes and a plurality of second electrodes extending in a first direction. The wiring portion includes a first wiring connected to the plurality of first electrodes of the first solar cell, the first wiring includes a plurality of first partial wirings in the second direction in the first solar cell, and the plurality of first partial wirings are different members from each other and are electrically connected to each other by a first connection portion on the first solar cell.

18 Claims, 10 Drawing Sheets

SOLAR CELL PANEL

CROSS-REFERENCE TO RELATED APPLICATION

This application claims the priority benefit of Korean Patent Application No. 10-2017-0105559 filed in the Republic of Korea on Aug. 21, 2017, the disclosure of which is incorporated herein by reference.

BACKGROUND OF THE INVENTION

Field of the Invention

Embodiments of the invention relate to a solar cell panel, and, more particularly, to a solar cell panel having an improved structure.

Description of the Related Art

Recently, as existing energy resources such as petroleum and coal are expected to be depleted, interest in alternative energy to replace them is increasing. Among them, solar cells are attracting attention as a next-generation battery that converts solar energy into electric energy.

A plurality of such solar cells are connected in series or in parallel by a wiring and are manufactured in a form of a solar cell panel by a packaging process for protecting the plurality of solar cells. Since a solar cell panel generates electricity for a long time in various environments, a solar cell panel is required to have long-term reliability. However, when expansion and contraction of a wiring for connecting a plurality of solar cells is repeated due to a change in temperature or the like, the wiring may be detached from a solar cell at a portion where adhesion is weak. As a result, an output of the solar cell panel is reduced, a defect rate is high, and long-term reliability may not be excellent.

SUMMARY OF THE INVENTION

Therefore, embodiments of the invention have been made in view of the above problems, and embodiments of the invention are to provide a solar cell panel having a high output, a low defect rate, and excellent long-term reliability.

A solar cell panel according to an embodiment of the invention includes a plurality of solar cells including a first solar cell and a second solar cell, and a wiring portion extending in a second direction crossing the first direction and electrically connecting the plurality of solar cells. Each of the plurality of solar cells includes a plurality of first electrodes and a plurality of second electrodes extending in a first direction. The wiring portion includes a first wiring connected to the plurality of first electrodes of the first solar cell, the first wiring includes a plurality of first partial wirings in the second direction in the first solar cell, and the plurality of first partial wirings are different members from each other and are electrically connected to each other by a first connection portion on the first solar cell.

According to an embodiment, a problem caused by expansion and contraction of a wiring member can be solved by using a wiring member composed of a plurality of partial wirings having a relatively short length. Accordingly, it is possible to prevent an output reduction of a solar cell panel and deterioration or a defect of the solar cell panel and to improve long-term reliability of the solar cell panel. Also, a structure of the wiring member connecting electrodes having different polarities in neighboring first and second solar cells can be simplified by differentiating an arrangement of the electrodes and connection portions in the first and second solar cells. Particularly, when electrodes having different polarities in the first and second solar cells are connected together by a common wiring, a connection structure can be simplified and an interval between the first and second solar cells can be reduced. Accordingly, efficiency of the solar cell panel can be greatly improved.

DETAILED DESCRIPTION OF THE EMBODIMENTS

Figure 1:
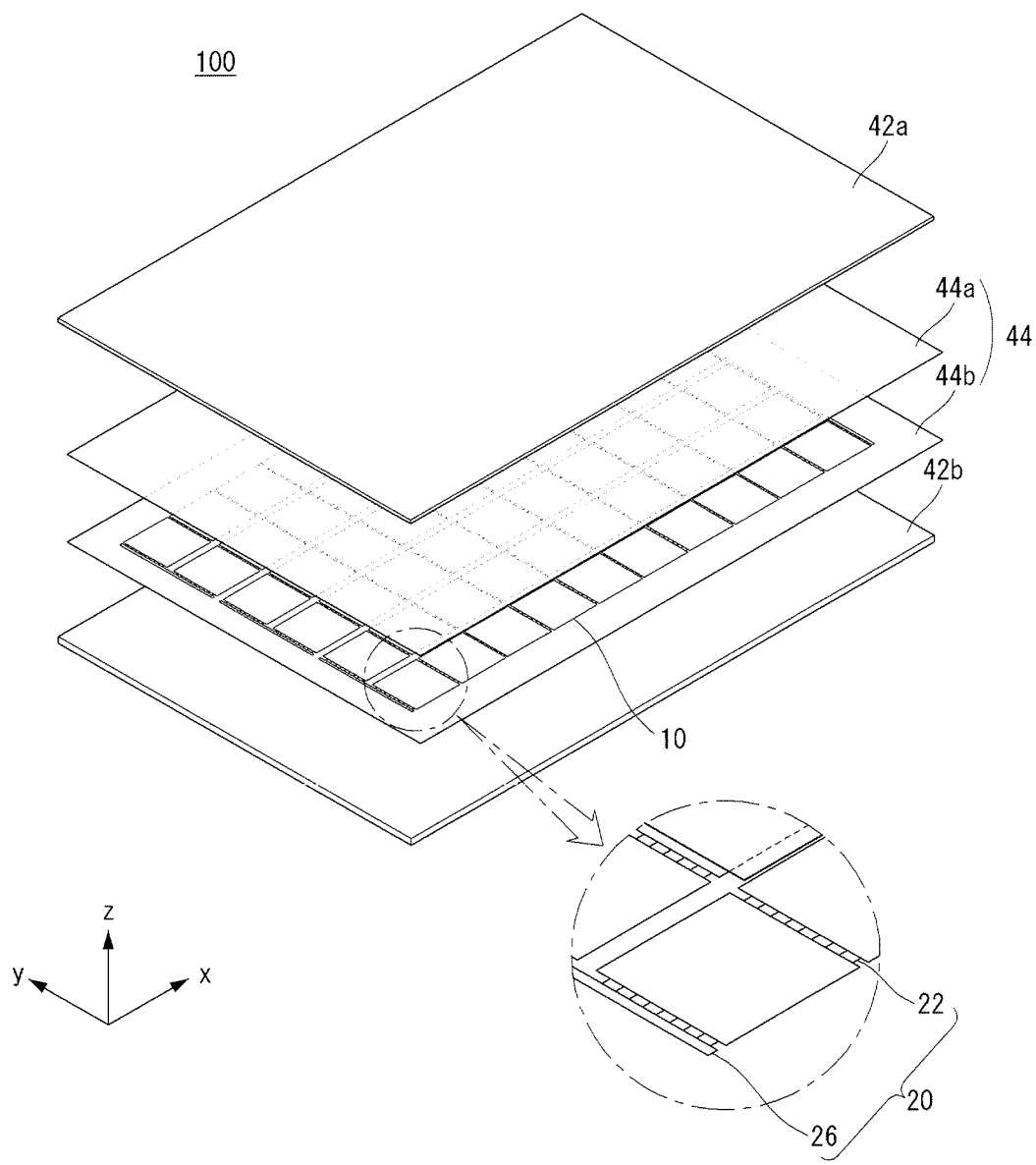
FIG. 1 is an exploded perspective view schematically showing a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also therebetween. Accordingly, when an element such as a layer, film, region, or plate is disposed "directly on" another element, this means that there is no intervening element between the elements.

Hereinafter, a solar cell panel according to an embodiment of the invention will be described in detail with reference to the accompanying drawings.

Figure 2:
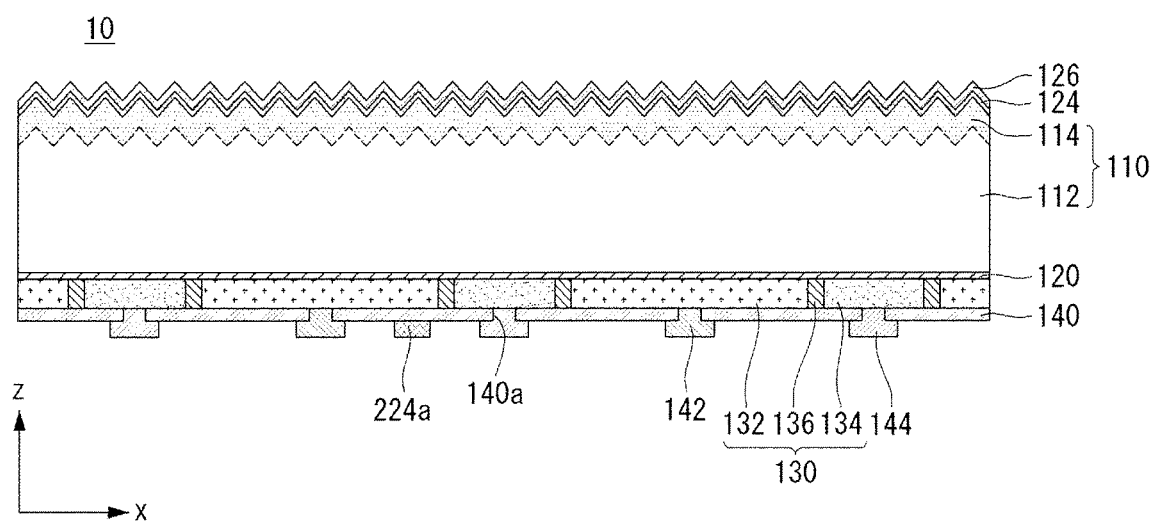
FIG. 2 is a cross-sectional view showing an example of a solar cell included in the solar cell panel shown in FIG. 1.

FIG. 1 is an exploded perspective view schematically showing a solar cell panel according to an embodiment of the invention, and FIG. 2 is a cross-sectional view showing an example of a solar cell included in the solar cell panel shown in FIG. 1. For reference. FIG. 2 is a cross-sectional view showing the solar cell taken along line II-II in FIG. 3.

Referring to FIGS. 1 and 2, a solar cell panel 100 according to the embodiment includes a plurality of solar cells 10 and a wiring portion 20 for electrically connecting the plurality of solar cells 10. The solar cell panel 100 includes a sealing member 44 that surrounds and seals the solar cells 10 and the wiring portion 20, a first member 42a positioned on a front surface of the solar cells 10 on the sealing member 44, and a back member 42b positioned on a back surface of the solar cells 10 on the sealing member 44. This will be described in more detail. In this instance, the solar cell 10 may include a semiconductor substrate 110 and a first electrode 142 and a second electrode 144 disposed on one surface (e.g., a back surface) of the semiconductor substrate 110. This will be described in detail later with reference to FIG. 2.

In the embodiment, the solar cell panel 100 may include a plurality of solar cells 10, and the plurality of solar cells 10 may be electrically connected in series, parallel, or series-parallel by a wiring portion 20.

More specifically, the wiring portion 20 may include a wiring member 22. At least a part of the wiring member 22 may overlap the first or second electrodes 142 or 144 of each solar cell 10 to be connected to the first or second electrodes 142 or 144. A plurality of solar cells 10 may be connected in one direction (an x-axis direction in the drawings) by the wiring member 22 to form one row (i.e., a solar cell string). The wiring portion 20 may further include a bus bar wiring 26 positioned at both ends of the solar cell string and connecting a solar cell string to another solar cell string or a junction box (not shown).

The wiring member 22 or the bus bar wiring 26 may each include a conductive material (for example, a metal material). For example, the wiring member 22 or the bus bar wiring 26 may include a conductive core including any one of gold (Au), silver (Ag), copper (Cu), and aluminum (Al), and a conductive coating layer that is disposed on a surface of the conductive core and includes tin (Sn) or an alloy including tin. In one example, the conductive core may be formed of copper (Cu), and the conductive coating layer may be formed of SnBiAg, which is an alloy including tin. However, embodiments of the invention are not limited thereto, and a material, a shape, a connection structure, etc. of the wiring member 22 or the bus bar wiring 26 may be variously modified.

The sealing member 44 may include a first sealing member 44a positioned on front surfaces of solar cells 10 connected by the wiring portion 20 and a second sealing member 44b positioned on back surfaces of the solar cells 10 connected by the wiring portion 20. The first sealing member 44a and the second sealing member 44b prevent moisture and oxygen from entering and chemically bind elements of the solar cell panel 100. The first and second sealing members 44a and 44b may be made of an insulating material having translucency and adhesiveness. For example, an ethylene-vinyl acetate copolymer resin (EVA), a polyvinyl butyral, a silicone resin, an ester-based resin, an olefin-based resin, or the like may be used for the first sealing member 44a or the second sealing member 44b. The back member 42b, the second sealing member 44b, the solar cells 10, the wiring portion 20, a shield member 50, and the first sealing member 44a, and the front member 42a may be integrated to constitute the solar cell panel 100 through a lamination process using the first and second sealing members 44a and 44b.

The front member 42a is disposed on the first sealing member 44a to constitute a front surface of the solar cell panel 100 and the back member 42b is disposed on the second sealing member 44b to constitute a back surface of the solar cell panel 100. The front member 42a and the back member 42b may be made of an insulating material capable of protecting the solar cells 10 from external shock, moisture, ultraviolet rays, or the like. The front member 42a may be made of a light-transmitting material capable of transmitting light, and the back member 42b may be made of a sheet made of a light-transmitting material, a non-light-transmitting material, or a reflective material. For example, the front member 42a may be formed of a glass substrate or the like, and the back member 42b may be formed of a film or a sheet. The back member 42b may have a TPT (Tedlar/PET/Tedlar) type or a polyvinylidene fluoride (PVDF) resin layer formed on at least one surface of a base film (for example, polyethylene terephthalate, PET).

However, embodiments of the invention are not limited thereto. Accordingly, the first or second sealing member 44a or 44b, the front member 42a, or the back member 42b may include any of various materials other than those described above, and may have any of various shapes. For example, the front member 42a or the back member 42b may have any of various forms (e.g., a substrate, a film, a sheet, etc.) or any of various materials.

Referring to FIG. 2, an example of a solar cell 10 included in the solar cell panel 100 according to the embodiment of the invention will be described in more detail.

Referring to FIG. 2, the solar cell 10 according to the embodiment includes a photoelectric conversion portion including a semiconductor substrate 110, and first and second electrodes 142 and 144 connected to the photoelectric conversion portion. In this instance, the first and second electrodes 142 and 144 may include portions formed in parallel with each other. In the embodiment, the first electrode 142 and the second electrode 144 may be formed parallel to each other while being positioned together on one surface (e.g., a back surface) of the photoelectric conversion portion. Thus, the solar cell 10 may have a back contact structure.

In the embodiment, the photoelectric conversion portion may include the semiconductor substrate 110 and a conductive region 132 and 134 positioned on or at the semiconductor substrate 110. In the embodiment, a first conductive region 132 and a second conductive region 134 that are involved in carriers having polarities opposite to each other may be positioned on one surface (e.g., the back surface) of the semiconductor substrate 110. In this instance, the first and second conductive regions 132 and 134 are positioned separately from the semiconductor substrate 110 by a control passivation layer 120 interposed therebetween.

In one example, the semiconductor substrate 110 may include a base region 112 made of a crystalline semiconductor (for example, a single-crystalline or a polycrystalline semiconductor, as an example, a single-crystalline or a polycrystalline silicon wafer, particularly, a single-crystalline silicon wafer) doped with a second conductive type dopant. The solar cell 10 based on the semiconductor substrate 110 or the base region 112 having a high degree of crystallinity and having few defects has excellent electrical properties. A front surface field region 114 having the same conductivity type as the base region 112 and having a higher doping concentration than the base region 112 may be positioned on or at the front surface of the semiconductor substrate 110. An anti-reflection structure (for example, a pyramid-shaped texturing structure including a (111) surface of the semiconductor substrate 110) for preventing reflection may be formed at the front surface of the semiconductor substrate 110, while the back surface of the semiconductor substrate 110 may be a mirror-polished surface or may have a smaller surface roughness than the front surface. However, embodiments of the invention are not limited thereto and various modifications are possible.

The control passivation layer 120 may be formed of an oxide layer, a dielectric layer or an insulating layer including silicon, an oxynitride layer, an oxycarbonate layer, or the like. As an example, the control passivation layer 120 may be a silicon oxide layer.

The first and second conductive regions 132 and 134 may be formed of an amorphous semiconductor, a microcrystalline semiconductor, a polycrystalline semiconductor (for example, amorphous silicon, microcrystalline silicon, or polycrystalline silicon) doped with a first or second conductive type dopant is doped. In particular, when the first and second conductive regions 132 and 134 have a polycrystalline semiconductor, a carrier mobility can be high. For example, when the first or second conductivity type dopant is p-type, a group 3 element such as boron (B), aluminum (Al), gallium (Ga), or indium (In) may be used. When the first or second conductivity type dopant is n-type, a group 5 element such as phosphorus (P), arsenic (As), bismuth (Bi), and antimony (Sb) may be used. In one example, one of the first and second conductivity type dopants may be boron (B) and the other may be phosphorus (P).

In this instance, an area (for example, a width) of the first conductive region 132 may be larger than an area (for example, a width) of the second conductive region 134. The first conductive region 132 serving as an emitter region has a larger area than the second conductive region 134 serving as a back surface field region, which is advantageous for photoelectric conversion. In the embodiment, the first and second conductive regions 132 and 134 are co-positioned in a semiconductor layer 130 to be positioned in the same plane, and a barrier region 136 formed of an intrinsic semiconductor, which is not doped, may be provided between the first and second conductive regions 132 and 134.

However, embodiments of the invention are not limited thereto. Therefore, the control passivation layer 120 may not be provided. Alternatively, at least one of the first and second conductive regions 132 and 134 may be a doped region formed by doping a part of the semiconductor substrate 110 to constitute a part of the semiconductor substrate 110. Also, the barrier region 136 may be not provided, or the barrier region 136 may include a material other than a semiconductor material or may be formed of an empty space. Various other variations are possible.

A front passivation layer 124 and/or an anti-reflection layer 126 is entirely formed on the front surface of the semiconductor substrate 110 (more particularly, on the front surface field region 114 formed on or at the front surface of the semiconductor substrate 110). A back passivation layer 140 may be entirely positioned on the back surface of the semiconductor layer 130 except for a contact hole 140a. For example, the front passivation layer 124, the anti-reflection layer 126, or the back passivation layer 140 may include one layer of a silicon nitride layer, a silicon nitride layer including hydrogen, a silicon oxide layer, a silicon oxynitride layer, an aluminum oxide layer, a silicon carbide layer, $MgF_2$, $ZnS$, $TiO_2$, and $CeO_2$, or a multi-layered structure which two or more layers including at least one of the above are stacked.

The first electrode 142 is electrically connected to (e.g., in contact with) the first conductive region 132 through the contact hole 140a and the second electrode 144 is electrically connected to (e.g., in contact with) the second conductive region 134 through the contact hole 140a. The first electrode 142 and the second electrode 144 may be formed of a conductive material (e.g., a metal). In the embodiment, the solar cell 10 may further include a pad electrode 224a and 224b (refer to FIG. 3), which will be described later in more detail with reference to FIGS. 3 and 4.

The solar cell 10 is electrically connected to another solar cell 10 by the wiring portion 20 including the wiring member 22. Hereinafter, a structure of the solar cell 10 and the wiring portion 20 will be described in more detail with reference to FIGS. 3 and 4.

Figure 3:
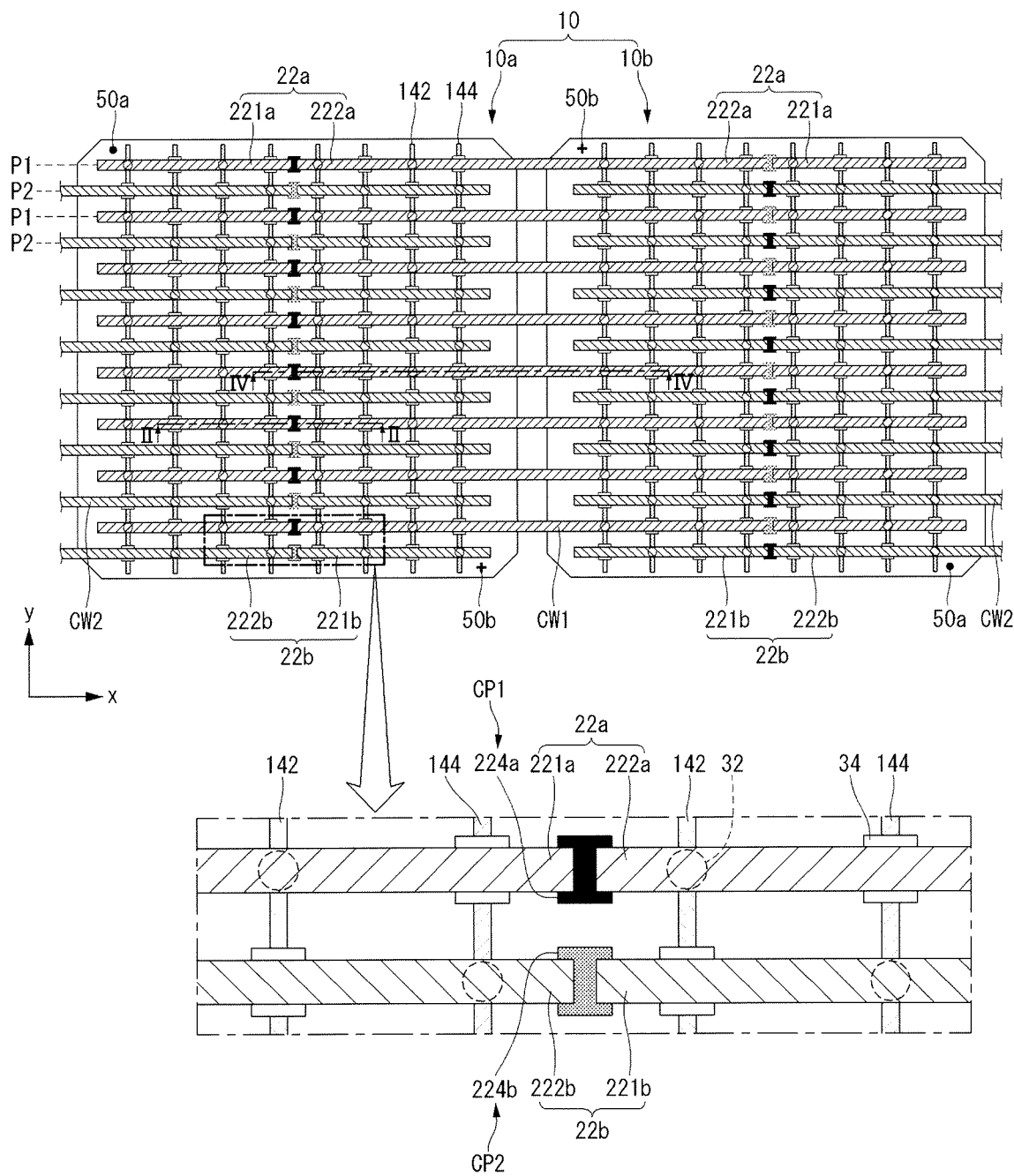
FIG. 3 is a back plan view schematically showing two solar cells, a wiring member, an insulating member, and a connecting member included in the solar cell panel shown in FIG. 1.
Figure 4:
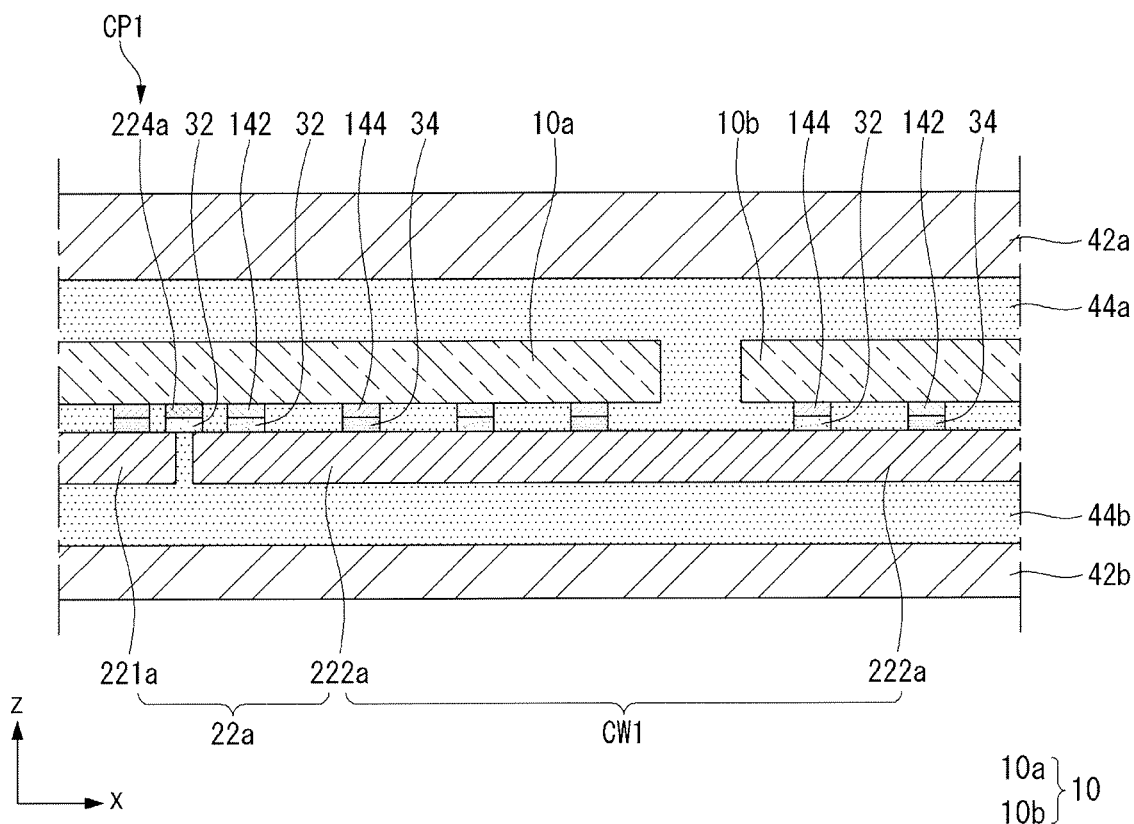
FIG. 4 is a cross-sectional view showing the solar cell panel taken along line IV-IV of FIG. 3.

FIG. 3 is a back plan view schematically showing two solar cells 10, a wiring member 22, an insulating member 34, and a connecting member 32 included in the solar cell panel 100 shown in FIG. 1. FIG. 4 is a cross-sectional view showing the solar cell panel 100 taken along line IV-IV of FIG. 3. Two solar cells 10 adjacent to each other are referred to as a first solar cell 10a and a second solar cell 10b in the following description for clear distinction.

Referring to FIGS. 1 to 4, a first electrode 142 of a first solar cell 10a and a second electrode 144 of a second solar cell 10b are electrically connected by a plurality of wiring members 22.

More particularly, in each of the first and second solar cells 10a and 10b, the first electrode 142 may include a plurality of first electrodes 142 longitudinally extending in a first direction (a y-axis direction in the drawings), and the second electrode 144 may include a plurality of second electrodes 144 longitudinally extending in the first direction. In addition, the first electrodes 142 and the second electrodes 144 may be alternately disposed in a second direction (an x-axis direction in the drawings) crossing the first direction.

In this instance, the first and second conductive regions 132 and 134 may have shapes corresponding to the first and second electrodes 142 and 144, respectively. Accordingly, the first conductive region 132 may include a plurality of portions extending in the first direction to correspond to the plurality of first electrodes 142. The second conductive region 134 may include a plurality of portions extending in the first direction to correspond to the plurality of second electrodes 144. However, the first and second conductive regions 132 and 134 may have a greater width than the first and second electrodes 142 and 144, respectively. A barrier region 136 may be positioned between the first conductive region 132 and the second conductive region 134. However, embodiments of the invention are not limited thereto, and the first and second conductive regions 132 and 134 may have different shapes from the first and second electrodes 142 and 144.

In this instance, the wiring member 22 in each of the first and second solar cells 10a and 10b may include a first wiring 22a connected to one of the first and second electrodes 142 and 144 and a second wiring 22b connected to the other of the second electrodes 142 and 144.

In this specification, the wiring members 22 positioned at one same position (for example, a first position P1) in the first direction in the first and second solar cells 10*a* and 10*b* are referred to as first wirings 22*a*, and the wiring members 22 positioned at another same position different from the first position P1 in the first direction (for example, the second position P2) are referred to as second wirings 22*b*. In each solar cell 10, any one of the first and second wirings 22*a* and 22*b* is electrically connected to the first electrode 142 through the connecting member 32 and is insulated from the second electrode 144 through the insulating member 34, and the other one of the first and second wirings 22*a* and 22*b* is electrically connected to the second electrode 144 through the connecting member 32 and is insulated from the first electrode 142 through the insulating member 34. The plurality of first wirings 22*a* and the plurality of second wirings 22*b* are provided in the solar cell 10, and the first wirings 22*a* and the second wirings 22*b* are alternately positioned in the first direction. Then, the plurality of first and second wirings 22*a* and 22*b* are connected to the first and second electrodes 142 and 144 with a uniform interval, and the carriers can be effectively transferred.

The connecting member 32 may include any of various conductive materials, and the insulating member 34 may include any of various insulating materials. For example, the connecting member 32 may be formed of a material included in the first and second electrodes 142 and 144 and/or the wiring member 22, or a mixed material including the material included in the first and second electrodes 142 and 144 and/or the wiring member 22. For example, the connecting member 32 may include the material included in the first and second electrodes 142 and 144 and/or the wiring member 22 by a process where the wiring member 22 is placed on the first and second electrodes 142 and 144 and is heated or so on. Alternatively, the connecting member 32 may include a solder paste layer, an epoxy solder paste layer, or the like. As an example, the connecting member 32 may include a low-temperature solder paste layer and a high-temperature solder paste layer together. The insulating member 34 may include any of a silicone-based resin, an epoxy-based resin, a urethane-based resin, an acryl-based resin, polyimide, polyethylene, and the like.

In the embodiment, the first wiring 22*a* may extend in the second direction to overlap the plurality of first electrodes 142 to be connected to the plurality of first electrodes 142 in the first solar cell 10*a*. Also, the second wiring 22*b* may extend in the second direction to overlap the plurality of second electrodes 144 to be connected to the plurality of second electrodes 144 in the first solar cell 10*a*. In this instance, in the first solar cell 10*a*, the first wiring 22*a* extends to one side (a right side in FIGS. 3 and 4) of the first solar cell 10*a* in the second direction and is electrically connected to the second solar cell 10*b* positioned at the one side (the right side in FIGS. 3 and 4) of the first solar cell 10*a*, and the second wiring 22*b* extends to the other side (a left side in FIGS. 3 and 4) of the first solar cell 10*a* and is electrically connected to a solar cell 10 (that is, a third solar cell) positioned at the other side (the left side in FIGS. 3 and 4) of the first solar cell 10*a*.

As a result, in the first solar cell 10*a*, the connecting members 32 may be positioned between the first wiring 22*a* and the plurality of first electrodes 142 at portions where the first wiring 22*a* and the plurality of first electrodes 142 overlap each other, and the insulating members 34 may be positioned between the first wiring 22*a* and the plurality of second electrodes 144 at portions where the first wiring 22*a* and the plurality of second electrodes 144 overlap each other. Also, in the first solar cell 10*a*, the connecting members 32 may be positioned between the second wiring 22*b* and the plurality of second electrodes 144 at portions where the second wiring 22*b* and the plurality of second electrodes 144 overlap each other, and the insulating members 34 may be positioned between the second wiring 22*b* and the plurality of first electrodes 142 at portions where the second wiring 22*b* and the plurality of first electrodes 142 overlap each other.

In this instance, the first wiring 22*a* may include a plurality of first partial wirings 221*a* and 222*a* in the second direction in the first solar cell. The first partial wirings 221*a* and 222*a* are different members having separate structures from each other and are electrically connected to each other by a first connection portion CP1 on the first solar cell 10*a*. The plurality of first partial wirings 221*a* and 222*a* included in the first wiring 22*a* may be positioned at the same position in the first direction and extend in the second direction. Then, a length of each of the first partial wirings 221*a* and 222*a* constituting the first wirings 22*a* can be reduced, and thus, a problem that may occur when a length of the first wirings 22*a* or lengths of the first partial wirings 221*a* and 222*a* constituting the first wirings 22*a* are large can be prevented.

More particularly, when temperature changes in an environment where the solar cell panel 100 is positioned, expansion and contraction of the wiring member 22 (that is, the first and second wirings 22*a* and 22*b*) are repeated. In this instance, the wiring member 22 may be separated from the solar cell 10 or the wiring member 22 may be damaged or torn by the expansion and contraction of the wiring member 22. Such a problem may become more serious as the length of the wiring member 22 becomes larger. If such a problem occurs, the solar cell panel 100 may be judged as defective and an output of the solar cell panel 100 may be lowered. Particularly, in a structure in which the first and second electrodes 142 and 144 and the wiring member 22 are positioned only on one surface of the solar cell 10 as in the embodiment, the problem caused by the expansion and contraction of the wiring member 22 may be more serious.

In view of this, in the embodiment, the problem caused by the expansion and contraction of the wiring member 22 can be prevented by using the first wiring 22*a* composed of the plurality of first partial wirings 221*a* and 222*a* having a relatively short length. Accordingly, it is possible to prevent an output reduction of the solar cell panel 100 and deterioration or a defect of the solar cell panel 100 and to improve long-term reliability of the solar cell panel 100.

The plurality of first partial wirings 221*a* and 222*a* may include at least one first internal wiring 221*a* positioned only in the first solar cell 10*a* and at least one first extended wiring 222*a* electrically connected to the first internal wiring 221*a* and extending from a side adjacent to the first internal wiring 221*a* to an outside of one side (a right side in FIGS. 3 and 4) of the first solar cell 10*a*.

For example, with respect to one first wiring 22*a* of the first solar cell 10*a*, one first internal wiring 221*a* is provided and one first extended wiring 222*a* is provided, and one first connection portion CP1 where the first internal wiring 221*a* and the first extended wiring 222*a* are connected is provided in the first solar cell 10*a*. Thus, a number of the plurality of first partial wirings 221*a* and 222*a* can be minimized, and a process of attaching the first wirings 22*a* can be simplified. However, embodiments of the invention are not limited thereto. At least two first internal wirings 221*a* may be provided in the first solar cell 10*a*. In this instance, a number of the first connection portions CP1 may be equal to a number of the first internal wirings 221*a*. In this instance, lengths of the first internal wirings 221a and intervals of the first connection portions CP1 may be uniform or may be different from each other.

In this instance, the first connection portion CP1 may be positioned at a central portion of the first solar cell 10a in the second direction. Then, the first internal wiring 221a and the first extended wiring 222a are symmetrically positioned in the first solar cell 10a, and a problem caused by thermal stress can be minimized. However, embodiments of the invention are not limited to this, and the first connection portion CP1 may be positioned at a part other than the central portion of the first solar cell 10a.

In the drawing, it is exemplified that each of a plurality of first wirings 22a includes a plurality of first partial wirings 221a and 222a. According to this, effect by the plurality of first partial wirings 221a and 222a can be maximized. However, embodiments of the invention are not limited to this, and at least one of the plurality of first wirings 22a may include a plurality of first partial wirings 221a and 222a. Also, it is exemplified that the first connection portions CP1 of the plurality of first wirings 22a are positioned at the same position in the first direction. However, embodiments of the invention are not limited thereto, and at least two first wires 22a having the first connection portions CP1 at different positions may be provided.

In the embodiment, the first connection portion CP1 may be a first pad electrode 224a formed on the first solar cell 10a. That is, the plurality of first partial wirings 221a and 222a are electrically connected to the first pad electrode 224a, respectively, so that the plurality of first partial wirings 221a and 222a can be electrically connected to each other. In FIGS. 3 and 4, it is exemplified that a part of each of the plurality of first partial wirings 221a and 222a is overlapped with the first pad electrode 224a. In this instance, as shown in FIG. 4, the connection members 32 may be positioned between the plurality of first partial wirings 221a and 222a and the first pad electrodes 224a so that the plurality of first partial wirings 221a and 222a and the first pad electrodes 224a are electrically and physically connected to each other. However, embodiments of the invention are not limited thereto. Therefore, the first partial wirings 221a and 222a and/or the first pad electrodes 224a may be melted using a soldering process without the connecting members 32, thereby connecting the first partial wirings 221a and 222a and the first pad electrodes 224a. Various other variations are possible.

In this instance, the first pad electrode 224a is positioned on an insulating layer (that is, the back passivation layer 140). Thus, the first pad electrode 224a may be a floating electrode being spaced apart from the semiconductor substrate 110 and the first and second conductive regions 132 and 134 and the first pad electrode 224a may be involved only in the connection between the plurality of first partial wirings 221a and 222a. As a result, problems such as unwanted shunts and the like can be effectively prevented without modifying a design of the first and second conductive regions 132 and 134. However, embodiments of the invention are not limited thereto. The first pad electrode 224a may be connected to the first conductive region 132 through the insulating layer. Then, the first pad electrode 224a may be formed together with the first electrode 142 to simplify a process. Alternatively, the first pad electrode 224a may be an electrode extended from the first electrode 142. Various other variations are possible.

The first pad electrode 224a may be formed of any of various materials having conductivity (e.g., a metal). The first pad electrode 224a may be formed of the same material as the first and/or second electrodes 142 and/or 144, or may be formed of different materials from the first and/or second electrodes 142 and/or 144.

In the drawings, it is exemplified that a width of the first pad electrode 224a in the first direction is larger than a width of the first wiring 22a (that is, widths of the plurality of first partial wirings 221a and 222a) in the first direction for stable connection. The plurality of first partial wirings 221a and 222a may be spaced apart from each other on the first pad electrode 224a to minimize the length of the plurality of first partial wirings 221a and 222a. However, embodiments of the invention are not limited thereto. Therefore, the width of the first pad electrode 224a in the first direction may be equal to or smaller than the width of the first wiring 22a (that is, the widths of the plurality of first partial wirings 221a and 222a) in the first direction. Also, the plurality of first partial wirings 221a and 222a may be connected to each other or may overlap each other on the first pad electrode 224a. Various other variations are possible.

Similarly, the second wiring 22b may include a plurality of second partial wirings 221b and 222b in the second direction in the second solar cell. The second partial wirings 221b and 222b are different members having separate structures from each other and are electrically connected to each other by a second connection portion CP2 on the first solar cell 10a. The plurality of second partial wirings 221b and 222b included in the second wiring 22b may be positioned at the same position in the first direction and extend in the second direction. Then, a length of each of the second partial wirings 221b and 222b constituting the second wirings 22b can be reduced, and thus, a problem that may occur when a length of the second wirings 22b or lengths of the second partial wirings 221b and 222b constituting the second wirings 22b are large can be prevented. Accordingly, it is possible to prevent an output reduction of the solar cell panel 100 and deterioration or a defect of the solar cell panel 100 and to improve long-term reliability of the solar cell panel 100.

In this instance, the plurality of second partial wirings 221b and 222b may include at least one second internal wiring 221b positioned only in the first solar cell 10a and at least one second extended wiring 222b electrically connected to the second internal wiring 221b and extending from a side adjacent to the second internal wiring 221b to an outside of the other side (a left side in FIGS. 3 and 4) of the first solar cell 10a.

For example, with respect to one second wiring 22b of the first solar cell 10a, one second internal wiring 221b is provided and one second extended wiring 222b is provided, and one second connection portion CP2 where the second internal wiring 221b and the second extended wiring 222b are connected is provided in the first solar cell 10a. However, embodiments of the invention are not limited thereto. At least two second internal wirings 221b may be provided in the first solar cell 10a. In this instance, a number of the second connection portions CP2 may be equal to a number of the second internal wirings 221b. In this instance, lengths of the second internal wirings 221b and intervals of the second connection portions CP2 may be uniform or may be different from each other.

In this instance, the second connection portion CP2 may be positioned at a central portion of the first solar cell 10a in the second direction. However, embodiments of the invention are not limited to this, and the second connection portion CP2 may be positioned at a part other than the central portion of the first solar cell 10a.

In the drawing, it is exemplified that each of a plurality of second wirings 22b includes a plurality of second partial wirings 221b and 222b. According to this, effect by the plurality of second partial wirings 221b and 222b can be maximized. However, embodiments of the invention are not limited to this, and at least one of the plurality of second wirings 22b may include a plurality of second partial wirings 221b and 222b. Also, it is exemplified that the second connection portions CP2 of the plurality of second wirings 22b are positioned at the same position in the second direction. However, embodiments of the invention are not limited thereto, and at least two second wires 22b having the second connection portions CP2 at different positions may be provided.

In the embodiment, the second connection portion CP2 may be a second pad electrode 224b formed on the first solar cell 10a. That is, the plurality of second partial wirings 221b and 222b are electrically connected to the second pad electrode 224b, respectively, so that the plurality of second partial wirings 221b and 222b can be electrically connected to each other. In FIGS. 3 and 4, it is exemplified that a part of each of the plurality of second partial wirings 221b and 222b is overlapped with the second pad electrode 224b. The connection members 32 may be positioned between the plurality of second partial wirings 221b and 222b and the second pad electrodes 224b. Alternatively, the second partial wirings 221b and 222b and/or the second pad electrodes 224b may be melted using a soldering process without the connecting members 32, thereby connecting the second partial wirings 221b and 222b and the second pad electrodes 224b. Various other variations are possible.

In this instance, the second pad electrode 224b is positioned on an insulating layer (that is, the rear passivation layer 140). Thus, the second pad electrode 224b may be a floating electrode being spaced apart from the semiconductor substrate 110 and the second and second conductive regions 132 and 134 and the second pad electrode 224b may be involved only in the connection between the plurality of second partial wirings 221b and 222b. However, embodiments of the invention are not limited thereto. The second pad electrode 224b may be connected to the second conductive region 132 through the insulating layer. Then, the second pad electrode 224b may be formed together with the second electrode 142 to simplify a process.

The second pad electrode 224b may be formed of any of various materials having conductivity (e.g., a metal). The second pad electrode 224b may be formed of the same material as the first and/or second electrodes 142 and/or 144, or may be formed of different materials from the first and/or second electrodes 142 and/or 144.

In FIG. 3, it is exemplified that a width of the second pad electrode 224b in the first direction is larger than a width of the second wiring 22b (that is, widths of the plurality of second partial wirings 221b and 222b) in the first direction for stable connection. The plurality of second partial wirings 221b and 222b may be spaced apart from each other on the second pad electrode 224b to minimize the length of the plurality of second partial wirings 221b and 222b. However, embodiments of the invention are not limited thereto. Therefore, the width of the second pad electrode 224b in the first direction may be equal to or smaller than the width of the second wiring 22b (that is, the widths of the plurality of second partial wirings 221b and 222b) in the first direction. Also, the plurality of second partial wirings 221b and 222b may be connected to each other or may overlap each other on the second pad electrode 224b. Various other variations are possible.

As described above, the first wirings 22a and the second wirings 22b may be alternately arranged in the first direction. More specifically, in a portion adjacent to the one side (e.g., the right side in FIG. 3) of the first solar cell 10a, the first extended wirings 222a and the second internal wirings 221b may be alternatively positioned in the first direction. In the other portion, the first internal wirings 221a and the second extended wirings 222b may alternately be positioned in the first direction. As a result, the second solar cell 10b and the third solar cell positioned on both sides of the first solar cell 10a in the second direction can be electrically connected in series to the first solar cell 10. In FIG. 3, the first pad electrode 424a and the second pad electrode 424b are positioned at the same positions when viewed in the second direction, but embodiments of the invention are not limited thereto.

In the embodiment, a connection structure of the first and second wirings 22a and 22b, the first and second electrodes 142 and 144, and the first and second connection portions CP1 and CP2 in the second solar cell 10b positioned adjacent to the one side of the first solar cell 10a may be different from that in the first solar cell 10a. The above description of the first and second wirings 22a and 22b, the first and second electrodes 142 and 144 and the first and second connection portions CP1 and CP2 in the first solar cell 10a may be applied as it is to the first and second wirings 22a and 22b, the first and second electrodes 142 and 144 and the first and second connection portions CP1 and CP2 in the second solar cell 10b, except for the connection structure.

More specifically, in the second solar cell 10b, the first wiring 22a is electrically connected to the second electrode 144, and the second wiring 22b is electrically connected to the first electrode 142. In contrast to the first solar cell 10a, in the second solar cell 10b, the first internal wiring 221a is positioned on the one side (the right side in FIGS. 3 and 4) of the second solar cell 10b, and the first extended wiring 222a extends to the other side (the left side in FIGS. 3 and 4) of the second solar cell 10b. In contrast to the first solar cell 10a, in the second solar cell 10b, the second internal wiring 221b is positioned on the other side of the second solar cell 10b and the second extended wiring 222b extends to the one side of the second solar cell 10b. Accordingly, in a portion adjacent to the one side (e.g., the right side in FIG. 3) of the second solar cell 10b, the first internal wirings 221a and the second extended wirings 222b may be alternatively positioned in the first direction. In the other portion, the first extended wirings 222a and the second internal wirings 221b may alternately be positioned in the first direction. Also, the first wirings 22a and the second wirings 22b are alternatively positioned in the first direction in the second solar cell 10b; however, it is contrary to an arrangement in the first solar cell 10a. That is, when viewed in the first direction, an order of the first connection portion CP1 and the second connection portion CP2 is repeated in the first solar cell 10a, while an order of the second connection portion CP2 and the first connection portion CP1 is repeated in the second solar cell 10b.

When the first and second wirings 22a and 22b are connected to the electrodes 142 and 144 having different polarities in the first and second solar cells 10a and 10b as described above, the first electrode 142 of the first solar cell 10a and the second electrode 144 of the second solar cell 10b are electrically connected to each other by connecting the first wiring 22a of the first solar cell 10a and the first wiring 22a of the second solar cell 10b. Also, the second electrode 144 of the first solar cell 10a and the first electrode 142 of another solar cell 10 (that is, a third solar cell 10)

positioned on the other side (the left side of FIG. 3) of the first solar cell 10*a* are electrically connected to each other by connecting the second wiring 22*b* of the first solar cell 10*a* and the second wiring 22*b* of the third solar cell 10. Further, the first electrode 142 of the second solar cell 10*b* and the second electrode 144 of other solar cell 10 (that is, a fourth solar cell 10) positioned on the one side (the right side of FIG. 3) of the second solar cell 10*b* are electrically connected to each other by connecting the second wiring 22*b* of the first solar cell 10*a* and the second wiring 22*b* of the fourth solar cell 10. That is, the plurality of solar cells 10 can be electrically connected with each other by connecting the first wirings 22*a* positioned at the same first position P1 in the first direction in the two neighboring solar cells 10 with each other and connecting the second wirings 22*b* positioned at the same second position P2 in the first direction in the two neighboring solar cells 10 with each other. Thus, the plurality of solar cells 10 can be electrically connected with each other by an easy and simple structure.

In one example, the first extended wiring 222*a* of the first solar cell 10*a* and the first extended wiring 222*a* of the second solar cell 10*b*, which are positioned at the same position in the first direction, are formed of a single first common wiring CW1 having a single body having an elongated structure. The first common wiring CW1 extends from the first connection portion CP1 of the first solar cell 10*a* to the second connection portion CP2 of the second solar cell 10*b* through a space between the first solar cell 10*a* and the second solar cell 10*b*. In this instance, the first common wiring CW1 is connected to the first electrode 142 in the first solar cell 10*a* and is connected to the second electrode 144 in the second solar cell 10*b*. Then, a total number of the first wirings 22*a* formed of the plurality of first partial wirings 221*a* and 222*a* in the first and second solar cells 10*a* and 10*b* can be reduced, and thus, an attaching process of the wiring portion 20 can be simplified.

Similarly, the second extended wiring 222*b* of the first solar cell 10*a* and the second extended wiring 222*b* of the third solar cell 10 that is positioned at the other side (the left side of FIG. 3), which are positioned at the same position in the first direction, are formed of a single second common wiring CW2 having a single body having an elongated structure. The second common wiring CW2 extends from the second connection portion CP2 of the first solar cell 10*a* to the second connection portion CP2 of the third solar cell 10 through a space between the first solar cell 10*a* and the third solar cell 10. In this instance, the second common wiring CW2 is connected to the second electrode 144 in the first solar cell 10*a* and is connected to the first electrode 142 in the third solar cell 10.

Also, the second extended wiring 222*b* of the second solar cell 10*b* and the second extended wiring 222*b* of the fourth solar cell 10 that is positioned at the one side (the right side of FIG. 3), which are positioned at the same position in the first direction, are formed of a single second common wiring CW2 having a single body having an elongated structure. The second common wiring CW2 extends from the first connection portion CP1 of the second solar cell 10*b* to the second connection portion CP2 of the fourth solar cell 10 through a space between the second solar cell 10*b* and the fourth solar cell 10. In this instance, the second common wiring CW2 is connected to the first electrode 142 in the second solar cell 10*b* and is connected to the second electrode 144 in the fourth solar cell 10.

On the other hand, when the first wiring is connected to the first electrode 142 only and the second wiring is connected to the second electrode 144 only in each solar cell 10, an additional or separate wiring or structure for connecting the first wiring of the first solar cell 10*a* and the second wiring of the second solar cell 10*b* is required. For example, an additional wiring, which is formed in a direction crossing the first and second wirings 22*a* and 22*b* (for example, a connection wiring 24 shown in FIG. 10) between the first solar cell 10*a* and the second solar cell 10*b*, or the like are required.

In the embodiment, the above-described additional or separate wiring or the structure or the additional wiring formed in the direction crossing the first and second wirings 22*a* and 22*b* can be removed, and an attaching process of the wiring portion 20, a material cost, and the like can be reduced. In addition, an interval between the first solar cell 10*a* and the second solar cell 10*b* can be reduced, and efficiency of the solar cell panel 100 can be improved. Also, end portions of the plurality of first partial wirings 221*a* and 222*a* and the plurality of second partial wirings 221*b* and 222*b* are spaced apart from an edge of the solar cell 10 (for example, at a central portion). Thus, the end portions of the plurality of first partial wirings 221*a* and 222*a* and the plurality of second partial wirings 221*b* and 222*b* are fixed by the connecting members 32 closely or densely positioned, and therefore, fixing stability of the plurality of first partial wirings 221*a* and 222*a* and the plurality of second partial wirings 221*b* and 222*b* can be enhanced.

In this instance, in the embodiment, after the same solar cells 10 are manufactured in plural, one solar cell 10 is used as the first solar cell 10*a* as it is, and the other neighboring solar cell 10 is rotated 180 degrees and is used as the second solar cell 10*b*. That is, the first solar cell 10*a* and the second solar cell 10*b* may be symmetric in origin. Such a pair of first and second solar cells 10*a* and 10*b* are repeatedly positioned so that a solar cell string composed of a plurality of solar cells 10 can be formed.

Thus, alignment marks 50*a* or 50*b* having the same shape may be positioned at different positions in the first solar cell 10*a* and the second solar cell 10*b*. For example, a first alignment mark 50*a* is positioned at an upper left side of FIG. 3 and a second alignment mark 50*b* is positioned at a lower right side of FIG. 3 in the first solar cell 10*a*, while a first alignment mark 50*a* is positioned at a lower right side of FIG. 3 and a second alignment mark 50*b* is positioned at an upper left side of FIG. 3 in the second solar cell 10*b*. It can be seen that one of the first and second solar cells 10*a* and 10*b* is positioned as it is and the other is rotated 180 degrees by the alignment marks 50*a* and 50*b*. Then, the plurality of solar cells 10 can be manufactured by the same process, and the first or second common wiring CW1 or CW2 can be applied, thereby simplifying a manufacturing process.

According to the embodiment, a problem caused by expansion and contraction of the wiring member 22 can be solved by using the wiring member 22 composed of the plurality of partial wirings 221*a* and 222*a* (221*b* and 222*b*) having a relatively short length. Accordingly, it is possible to prevent an output reduction of the solar cell panel 100 and deterioration or a defect of the solar cell panel 100 and to improve long-term reliability of the solar cell panel 100. Also, a structure of the wiring member 22 connecting the electrodes 142 and 144 having different polarities in the first and second solar cells 10*a* and 10*b* can be simplified by differentiating an arrangement of the electrodes 142 and 144 and the connection portions CP1 and CP2 in the first and second solar cells 10*a* and 10*b*. Particularly, when the electrodes 142 and 144 having different polarities in the neighboring first and second solar cells 10*a* and 10*b* are connected together by the common wirings CW1 and CW2, the connection structure can be simplified and an interval between the first and second solar cells 10a and 10b can be reduced. Accordingly, efficiency of the solar cell panel 100 can be greatly improved.

Although it is exemplified that the first wiring 22a has the plurality of first partial wirings 221a and 222a and the second wiring 22b has the plurality of second partial wirings 221b and 222b in the above, one of the first and second wirings 22a and 22b may have a plurality of wiring portions 221a and 222a or 221b and 222b.

Hereinafter, a solar cell panel according to other embodiments of the invention will be described in detail. The detailed description will be omitted for the same or extremely similar parts as the above description, and only the different parts will be described in detail. It is also within the scope of the invention to combine the above-described embodiment or variations thereof with the following embodiments or variations thereof.

Figure 5:
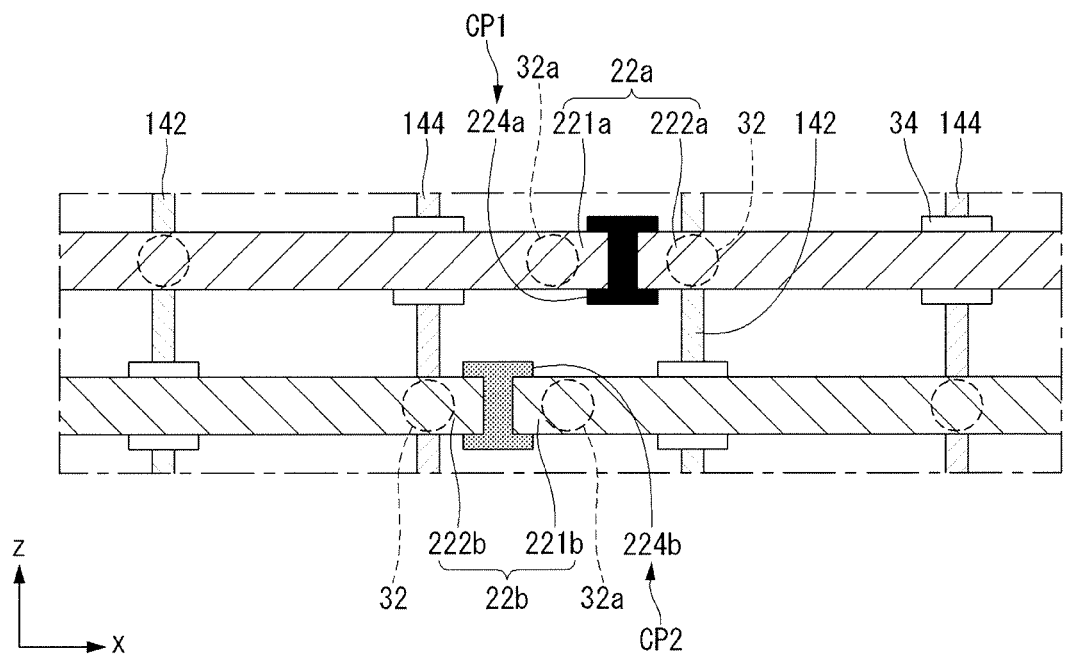
FIG. 5 is a back plan view schematically showing a solar cell panel according to another embodiment of the invention.

FIG. 5 is a back plan view schematically showing a solar cell panel according to another embodiment of the invention. For reference, a portion corresponding to the enlarged portion of FIG. 3 is shown in FIG. 5.

Referring to FIG. 5, in the embodiment, an auxiliary connecting member 32a is positioned at a portion spaced apart from a first pad electrode 224a and adjacent to an end portion of a first internal wiring 221a adjacent to the first pad electrode 224a. Thereby, an adhesion force of the first internal wiring 221a can be further improved. The auxiliary connecting member 32a is a connecting member positioned on an insulating layer (that is, a back passivation layer 140) at a portion where first and second electrodes 142 and 144 are not formed. The auxiliary connecting member 32a may be made of the same material as a connecting member 32 or may be made of a different material from the connecting member 32.

An end portion of the first extended wiring 222a adjacent to the first pad electrode 224a is connected and fixed by the connecting member 32 on the first electrode 142 at a portion spaced apart from the first pad electrode 224a and adjacent to the end portion of the first extended wiring 222a. Thus, an adhesion force of the first extended wiring 222a can be further improved. In this instance, since an auxiliary connecting member 32a for the first extended wiring 222a is not formed by using the connecting member 32 positioned on the first electrode 142 as it is, it is possible to reduce a material cost and simplify a process. However, embodiments of the invention are not limited thereto. Therefore, an auxiliary connecting member 32a may be further positioned at the end portion of the first extended wiring 222a. Alternatively, the connecting member 32 may be positioned at the end portion of the first internal wiring 221a and the auxiliary connecting member 32a may be positioned at the end portion of the first extended wiring 222a. Various other variations are possible.

As described above, the connecting member 32 or the auxiliary connecting member 32a is positioned at the portion spaced apart from the first pad electrode 224a and adjacent to the end portions of the first partial wirings 221a and 222a adjacent to the first pad electrode 224a. Thus, the adhesion force of the plurality of first partial wirings 221a and 222a can be improved.

Similarly, a connecting member 32 or an auxiliary connecting member 32a is positioned at each of portions spaced apart from a second pad electrode 224b and adjacent to end portions of a plurality of second partial wirings 221b and 222b adjacent to the second pad electrode 224b. An adhesion force of the second partial wirings 221b and 222b can be improved. In the drawing, it is exemplified that the positions of the first pad electrode 224a and the second pad electrode 224b in a second direction are different from each other and thus at least one end portions of the plurality of first partial wirings 221a and 222a and at least one end portions of the plurality of second partial wirings 221b and 222b are connected by the connecting member 32 to minimize a number of auxiliary connecting members 32a. However, embodiments of the invention are not limited thereto.

Figure 6:
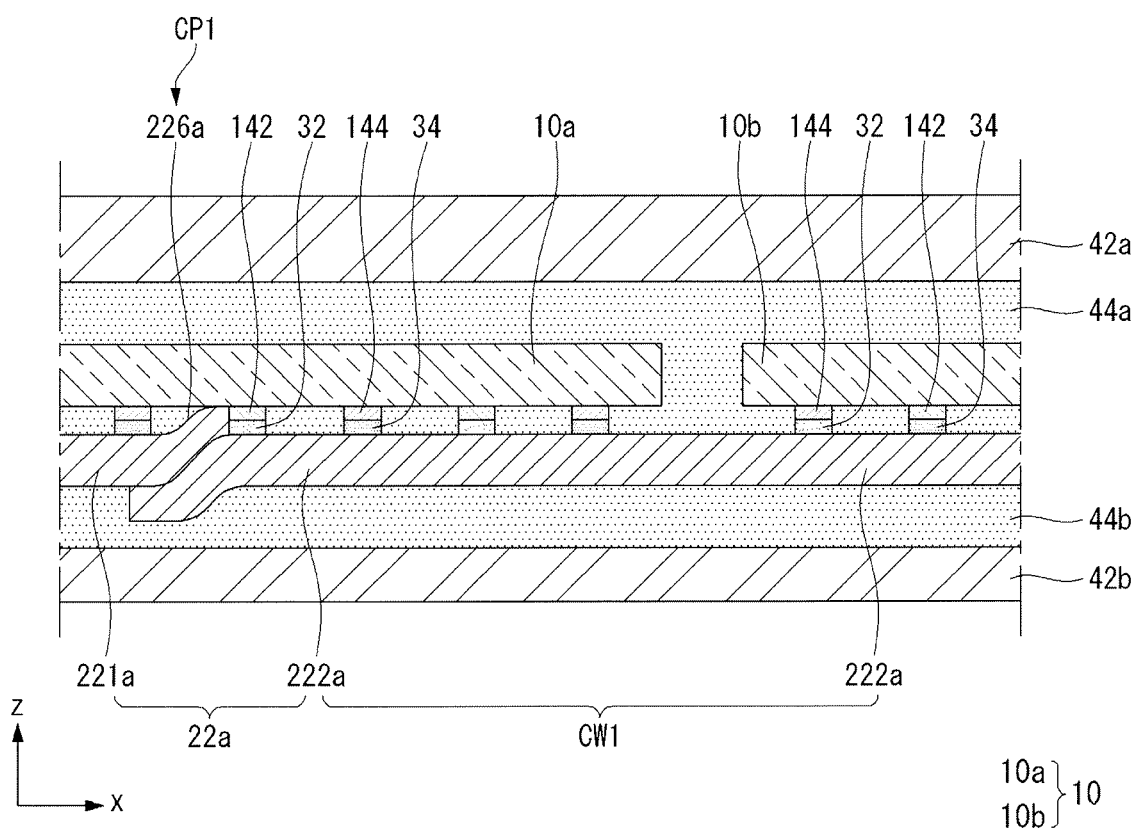
FIG. 6 is a partial cross-sectional view showing a solar cell panel according to yet another embodiment of the invention.

FIG. 6 is a partial cross-sectional view showing a solar cell panel according to yet another embodiment of the invention. For reference, a portion corresponding to FIG. 4 is shown in FIG. 6.

Referring to FIG. 6, in the embodiment, a plurality of first partial wirings 221a and 222a constituting a first wiring 22a include a first overlapping portion 226a where the plurality of first partial wirings 221a and 222a overlap each other at a first connection portion CP1 to be electrically connected each other. For example, the plurality of first partial wirings 221a and 222a may be electrically and physically connected to each other in the first overlapping portion 226a to form the first connection portion CP1. Although it is not shown in the drawing, a plurality of second partial wirings constituting a second wiring may overlap each other (for example, in contact with each other) and electrically connected to each other at a second overlapping portion for constituting a second connection portion. When the plurality of first partial wirings 221a and 222a or the plurality of second partial wirings are connected by overlapping each other in this manner, no separate structure or member for connecting them is required, so that the structure and process can be simplified.

Alternatively, a separate adhesive layer, an adhesive material, or the like for adhering the first partial wirings 221a and 222a or the plurality of second partial wirings between the first partial wirings 221a and 222a or the plurality of second partial wirings in the first overlapping portion 226a or the second overlapping portion may be further provided.

Figure 7:
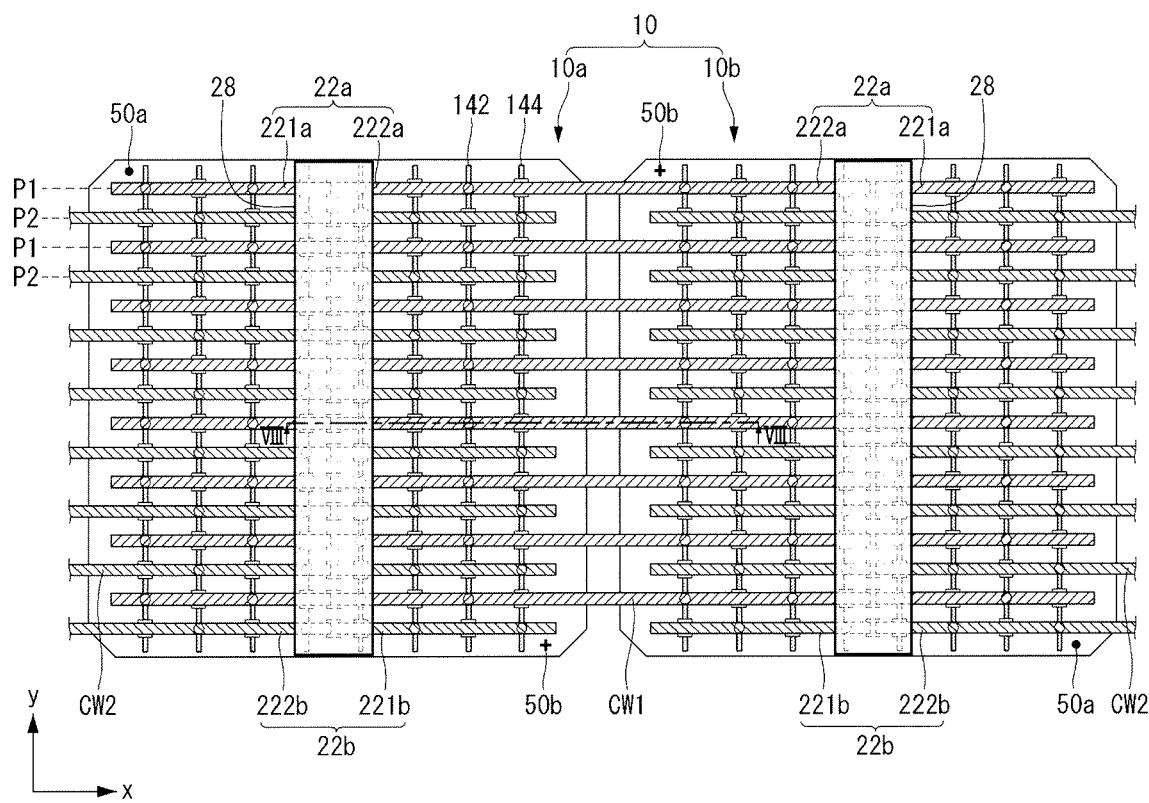
FIG. 7 is a back plan view schematically showing two solar cells, a wiring member, an insulating member, and a connecting member included in a solar cell panel according to still another embodiment of the invention.
Figure 8:
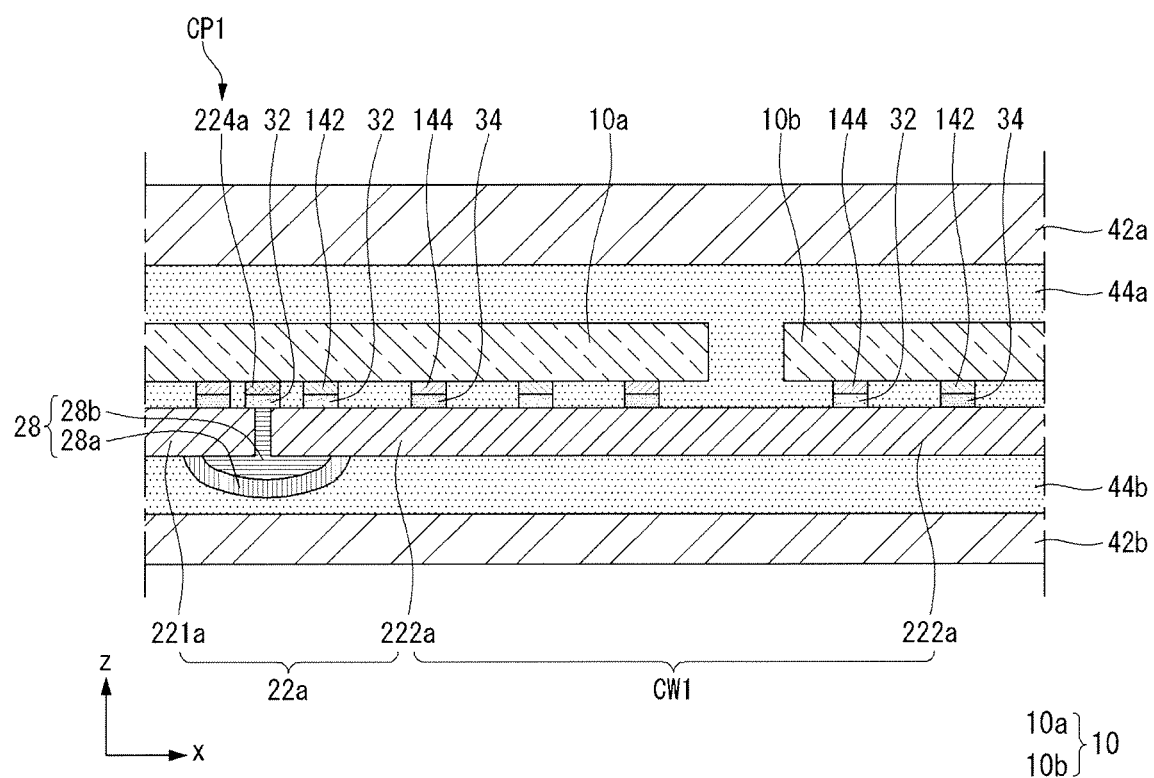
FIG. 8 is a cross-sectional view showing the solar cell panel taken along line VIII-VIII of FIG. 7.

FIG. 7 is a back plan view schematically showing two solar cells, a wiring member, an insulating member, and a connecting member included in a solar cell panel according to still another embodiment of the invention, and FIG. 8 is a cross-sectional view showing the solar cell panel taken along line VIII-VIII of FIG. 7.

Referring to FIGS. 7 and 8, in the embodiment, a fixing member 28 for fixing a plurality of first partial wirings 221a and 222a at a first connection portion CP1 and/or for fixing a plurality of second partial wirings 221b and 222b at a second connection portion CP2 may be further included. Thereby, the plurality of first and/or second partial wirings 221a and 222a and/or 221b and 222b can be stably fixed.

For example, the fixing member 28 may be formed to entirely cover portions of the plurality of first partial wirings 221a and 222a positioned at the first connection CP1. That is, the fixing member 28 can fix or attach at least the plurality of first partial wirings 221a and 222a to the solar cell 10.

In the embodiment, fixing stability of the plurality of first and/or second partial wirings 221a and 222a and/or 221b and 222b and strength of the plurality of first and/or second partial wirings 221a and 222a and/or 221b and 222b can be enhanced by the fixing member 28. Thus, it is possible to prevent the first partial wirings 221a and 222a and the second partial wirings 221b and 222b from being separated or damaged by repeated expansion and contraction of the wiring member 22. The first and/or second partial wirings 221a and 222a and/or 221b and 222b are surrounded by the fixing member 28 so that the sealing member 44 is spaced from the first and second connection portions CP1 and CP2 with the fixing member 28 therebetween at a surface where the fixing member 28 is positioned. Then, the sealing material 44 cannot penetrate between the solar cell 10 and the plurality of first or second partial wirings 221a and 222a or 221b and 222b at the first or second connection portion CP1 or CP2, and therefore, the fixing stability of the first and second wirings 22a and 22b can be further improved. Accordingly, it is possible to prevent an output reduction of a solar cell panel 100 and deterioration or a defect of the solar cell panel 100 and to improve long-term reliability of the solar cell panel 100.

In this instance, a width of the fixing member 28 in the second direction may be equal to or greater than a width of the first and second connection portions CP1 and CP2. Then, the fixing member 28 is formed to entirely and stably overlap a portion of first or second partial wirings 221a and 222a or 221b and 222b positioned at the first or second connection portions CP1 or CP2. By this shape, effect of the fixing member 28 can be maximized.

In this instance, the fixing member 28 may include any of various materials capable of fixing the first and second wirings 22a and 22b. For example, the fixing member 28 may be formed of an insulating tape including a base member 28a and an attaching layer 28b which is positioned on one surface of the base member 28a and connected to the wiring portion 20. When the fixing member 28 is made of a tape, the fixing member 28 can be fixed at a desired position by a simple process of attaching the tape.

The base member 28a serves to increase a strength of the fixing member 28. For example, the base member 28a may be made of a resin as a main component. For example, the base member 28a may include at least one of polyethylene (PE), polyethylene terephthalate (PET), and the like.

The attaching layer 28b may be fixed to the wiring member 22 by adhesion or cohesion, including an adhesive material or a cohesive material. Here, the term of "adhesion" means that two layers are attached to each other through a heat-treatment and thus one of the two layers is damaged when the two layers are separated. The term of "cohesion" means that two layers are attached and separated at a room temperature by a predetermined physical force without being damaged. When the attaching layer 28b includes the adhesive material, it can have better fixing properties. When the attaching layer 28b includes the cohesive material, the fixing member 28 can be easily detached when the fixing member 28 is attached incorrectly or when the solar cell 10 is replaced or repaired. For example, the attaching layer 28b may include an adhesive material or an cohesive material of an epoxy-based material, an acryl-based material, or a silicone-based material. Also, the fixing member 28 is not formed of an insulating tape but may be formed by applying or coating an adhesive material or a cohesive material.

In the drawings, the fixing member 28 has a shape extending along a first direction and partially positioned at a central portion in a second direction in which the first and second connection portions CP1 and CP2 are positioned to entirely cover the first and second connection portions CP1 and CP2. According to this, fixing stability of the first or second wiring portions 221a and 222a or 221b and 222b can be improved together by a simple structure and process. However, embodiments of the invention are not limited thereto, and the fixing member 28 corresponding to the first and second connection portions CP1 and CP2 may be separately formed. Various other variations are possible.

Figure 9:
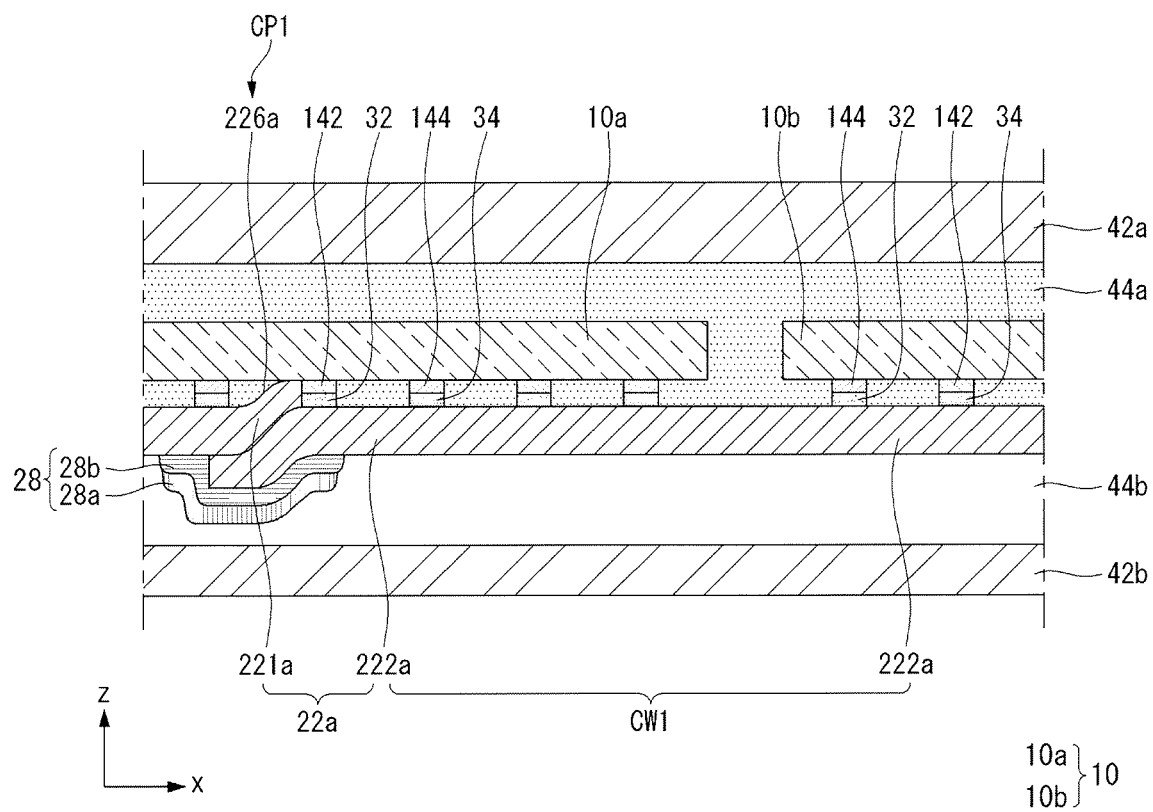
FIG. 9 is a cross-sectional view showing a solar cell panel according to a modified embodiment of the invention.

In FIGS. 7 and 8, the first and second connection portions CP1 and CP2 are formed of first and second pad electrodes 224a and 224b, respectively, as shown in FIG. 3. However, embodiments of the invention are not limited thereto. Therefore, as shown in FIG. 9, a fixing member 28 is applied when the first and/or second connection portions CP1 and/or CP2 are formed of overlapped portions where a plurality of first wiring portions 221a and 222a and/or a plurality of second wiring portions 221b and 222b overlap each other.

Figure 10:
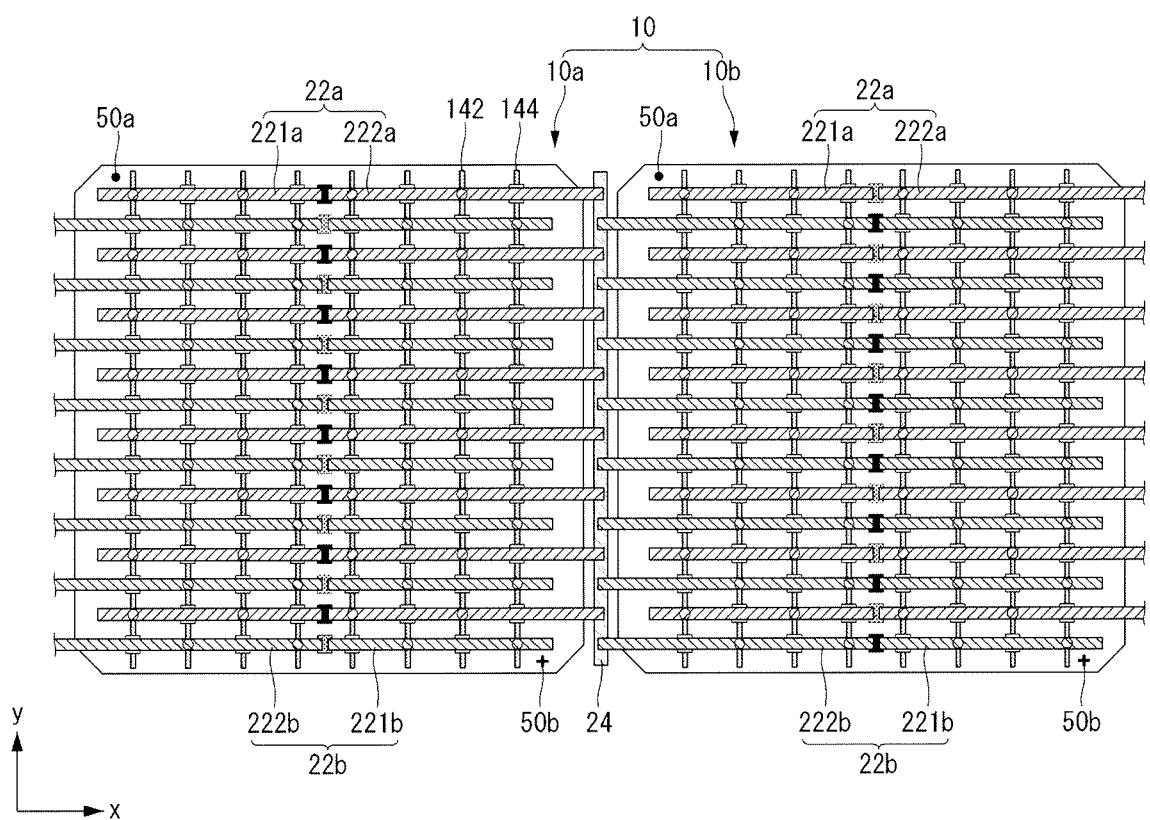
FIG. 10 is a back plan view schematically showing two solar cells, a wiring member, an insulating member, and a connecting member included in a solar cell panel according to yet still another embodiment of the invention.

FIG. 10 is a back plan view schematically showing two solar cells, a wiring member, an insulating member, and a connecting member included in a solar cell panel according to yet still another embodiment of the invention.

Referring to FIG. 10, in the embodiment, a connection structure of first and second wirings 22a and 22b, first and second electrodes 142 and 144, and first and second connection portions CP1 and CP2 in a first solar cell 10a is the same as a connection structure of first and second wirings 22a and 22b, first and second electrodes 142 and 144, and first and second connection portions CP1 and CP2 in a second solar cell 10b. Thus, in the each of the first and second solar cells 10a and 10b, the first wiring 22a is electrically connected to the first electrode 142 and is insulated from the second electrode 144, and the second wiring 22b is electrically connected to the second electrode 144 and is insulated from the first electrode 142.

A connection wiring 24 is provided between the first solar cell 10a and the second solar cell 10b. The connection wiring 24 is positioned in a direction (a first direction) crossing a wiring member 22 and connected to the wiring member 22. A plurality of solar cells 10 can be connected in a second direction (an x-axis direction in the drawing) by the wiring member 22 and the connection wiring 24 to form one row (i.e., a solar cell string).

More specifically, the first wiring 22a connected to the first electrode 142 of the first solar cell 10a and the second wiring 22b connected to the second electrode 144 of the second solar cell 10b are overlapped and connected to the connection wiring 24 extending in the first direction crossing the first and second wirings 22a and 22b. Thus, the first solar cell 10a and the second solar cell 10b can be connected in series in the second direction. In the drawing, it is exemplified that the first and second wirings 22a and 22b and the connection wirings 24 are separately formed and electrically connected to each other. In this instance, the first and second wirings 22a and 22b and the connection wirings 24 may be connected to each other by a conductive material layer (not shown). The conductive material layer may be the same material as the connecting member 32 or may be a different material. The connection wiring 24 may have the same material or structure as the wiring member 22 and/or a bus bar wiring 26 (refer to FIG. 1), or may have a different material or structure from the wiring member 22 and/or a bus bar wiring 26.

Since the wirings 22a and 22b in each solar cell 10 have the same arrangement, the solar cells 10 having the wirings 22a and 22b are individually manufactured and then are connected using the connection wiring 24. Thus, it is possible to easily manufacture a solar cell string. In addition, a plurality of first partial wirings 221a and 222a and a plurality of second partial wirings 221b and 222b (i.e., first and second internal wirings 221a and 221b and first and second extended wirings 222a and 222b) are all shorter than the length of each solar cell 10 in the second direction, and thus, a length of each portion of the wiring member 22 can be minimized.

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. A solar cell panel comprising:
a plurality of solar cells including a first solar cell and a second solar cell, each of the plurality of solar cells including a plurality of first electrodes connected to a first conductive region having a first conductive type, and a plurality of second electrodes extending in a first direction and connected to a second conductive region having a different conductive type from the first conductive type, wherein the first conductive region and the second conductive region are alternately formed on the same surface of the plurality of solar cells; and
a wiring member extending in a second direction crossing the first direction and electrically connecting the plurality of solar cells to each other,
wherein the wiring member includes a first wiring of the first solar cell, the first wiring being connected to the plurality of first electrodes of the first solar cell,
wherein the first wiring of the first solar cell is configured of a plurality of first wirings of the first solar cell in the second direction in the first solar cell,
wherein the plurality of first wirings of the first solar cell are separated from each other in the second direction and are electrically connected to each other by a first connection portion formed on the first solar cell, and the plurality of first wirings of the first solar cell are physically separated from each other with a gap in a center area of the first solar cell in the second direction, and
wherein the first connection portion is disposed between a first electrode of the plurality of first electrodes and an adjacent second electrode of the plurality of second electrodes in the center area of the first solar cell in the second direction, and is spaced apart from the first electrode and the adjacent second electrode.

2. The solar cell panel according to claim 1, wherein the plurality of first wirings of the first solar cell are located at a same position in the first direction.

3. The solar cell panel according to claim 1, wherein the plurality of first wirings of the first solar cell includes a first internal wiring in the first solar cell and a first extended wiring of the first solar cell that extends outside of the first solar cell.

4. The solar cell panel according to claim 3, wherein the first internal wiring in the first solar cell and the first extended wiring of the first solar cell have a same width, extend in a same direction and are positioned at a same location in the first direction.

5. The solar cell panel according to claim 3, wherein the first connection portion on the first solar cell is positioned at a central portion of the first solar cell in the second direction.

6. The solar cell panel according to claim 3, wherein the second solar cell includes a first wiring of the second solar cell and positioned at a same position in the first direction as the first wiring of the first solar cell, and
wherein the first wiring of the second solar cell is electrically connected to a second electrode of the plurality of second electrodes of the second solar cell.

7. The solar cell panel according to claim 6, wherein the first extended wiring of the first solar cell longitudinally extends in the second direction and is connected to the second electrode of the plurality of second electrodes of the second solar cell.

8. The solar cell panel according to claim 7, wherein the first wiring of the second solar cell includes a first internal wiring in the second solar cell and a first extended wiring of the second solar call that extends outside of the second solar cell, and
wherein the first extended wiring of the first solar cell and the first extended wiring of the second solar cell are formed of a first common wiring having a single body extending in the second direction.

9. The solar cell panel according to claim 6, wherein the first solar cell has a first alignment mark and the second solar cell has a second alignment mark,
wherein the first alignment mark of the first solar cell has a same shape as the second alignment mark of the second solar cell, and
wherein the first alignment mark and the second alignment mark are positioned at different positions in the first solar cell and the second solar cell.

10. The solar cell panel according to claim 6, wherein the first solar cell and the second solar cell are symmetrically arranged.

11. The solar cell panel according to claim 1, wherein the first connection portion on the first solar cell includes a first pad electrode among a plurality of first pad electrodes formed on the first solar cell, and
wherein the plurality of first wirings of the first solar cell are connected to the first pad electrode.

12. The solar cell panel according to claim 11, wherein a width of the first pad electrode of the first solar cell in the first direction is larger than a width of a corresponding first wiring among the plurality of first wirings of the first solar call, and
wherein the plurality of first wirings of the first solar cell are spaced apart from each other on corresponding first pad electrodes among the plurality of first pad electrodes.

13. The solar cell panel according to claim 11, wherein the first solar cell comprises a semiconductor substrate, and the plurality of first electrodes in the first solar cell and the plurality of second electrodes in the first solar cell are formed on the semiconductor substrate, and
wherein the first pad electrode of the first solar cell comprises a floating electrode spaced apart from the semiconductor substrate.

14. The solar cell panel according to claim 1, further comprising:
a fixing member fixing the plurality of first wirings of the first solar cell at the first connection portion on the first solar cell.

15. The solar cell panel according to claim 14, wherein the fixing member is formed of an insulating tape.

16. The solar cell panel according to claim 1, wherein the first solar cell and the second solar cell are electrically connected to each other without a wiring formed in a direction crossing the first wiring of the first solar cell and without a wiring formed in a direction crossing the first wiring of the second solar cell.

17. The solar cell panel according to claim 1, wherein the wiring member includes a second wiring connected to the plurality of second electrodes of the first solar cell,
wherein the second wiring includes a plurality of second wirings in the second direction in the first solar cell, and wherein the plurality of second wirings are separated from each other and are electrically, connected to each other by a second connection portion on the first solar cell.

18. The solar cell panel according to claim 17, wherein, in the first solar cell, the plurality of second wirings includes a second internal wiring disposed in the first solar cell and a second extended wiring extending outside of the first solar cell, and wherein the first extended wiring and the second internal wiring are alternately positioned in the first direction or the second extended wiring and the first internal wiring in the first solar cell are alternately positioned in the first direction.

* * * * *